(12) United States Patent
Raimondi et al.

(10) Patent No.: US 11,463,078 B2
(45) Date of Patent: Oct. 4, 2022

(54) MODULATOR CIRCUIT, CORRESPONDING DEVICE AND METHOD

(71) Applicant: STMicroelectronics S.r.l., Agrate Brianza (IT)

(72) Inventors: Marco Raimondi, Busto Garolfo (IT); Giovanni Gonano, Padua (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/322,100

(22) Filed: May 17, 2021

(65) Prior Publication Data

US 2021/0391856 A1 Dec. 16, 2021

(30) Foreign Application Priority Data

Jun. 16, 2020 (IT) .................. 102020000014302

(51) Int. Cl.
*H03K 7/08* (2006.01)
*H03F 3/217* (2006.01)
(Continued)

(52) U.S. Cl.
CPC .............. *H03K 7/08* (2013.01); *H03F 1/083* (2013.01); *H03F 1/3264* (2013.01); *H03F 3/183* (2013.01); *H03F 3/217* (2013.01); *H03F 3/2171* (2013.01); *H03F 3/2173* (2013.01); *H03F 3/2178* (2013.01); *H03K 5/24* (2013.01);
(Continued)

(58) Field of Classification Search
CPC ...... H03F 3/2178; H03F 3/2173; H03F 3/217; H03F 3/2171; H03F 1/3264; H03F 1/083; H03F 1/0222; H03F 1/0205; H03F 2200/03; H03F 2200/351; H03F 2200/78; H03F 3/183; H03K 7/08; H03K 5/24
USPC ................ 330/10, 251, 252, 253; 381/120; 327/175
See application file for complete search history.

(56) References Cited

U.S. PATENT DOCUMENTS 9,276,530 B1   3/2016   Liu et al.
9,595,946 B2   3/2017   Raimondi et al.
(Continued)

OTHER PUBLICATIONS

Choudhary et al., International Jl. Of Scientific and Engr. Research, vol. 3, Issue 5, May 2012 (Year: 2011).*
(Continued)

*Primary Examiner* — Arnold M Kinkead
(74) *Attorney, Agent, or Firm* — Slater Matsil, LLP

(57) ABSTRACT

An embodiment pulse-width modulation (PWM) modulator circuit comprises a first half-bridge stage having a first output node and a second half-bridge stage having a second output node. The first output node and the second output node are configured to have an electrical load coupled therebetween to apply thereto a PWM-modulated output signal. The circuit comprises a differential stage having input nodes configured to receive an input signal applied between the input nodes and produce a differential control signal for the first half-bridge stage and the second half-bridge stage. A current comparator is arranged intermediate the differential stage and the first and second half-bridge stages. The current comparator is configured to produce a PWM-modulated drive signal to drive the half-bridge stages as a function of the input signal applied between the input nodes in the differential stage.

22 Claims, 4 Drawing Sheets

(51) Int. Cl.
*H03F 1/32* (2006.01)
*H03K 5/24* (2006.01)
*H03F 1/08* (2006.01)
*H03F 3/183* (2006.01)

(52) U.S. Cl.
CPC .... *H03F 2200/03* (2013.01); *H03F 2200/351* (2013.01); *H03F 2200/78* (2013.01)

(56) References Cited

U.S. PATENT DOCUMENTS

| | | |
|---|---|---|
| 10,027,315 B2 | 7/2018 | Raimondi et al. |
| 10,560,082 B2 | 2/2020 | Botti et al. |
| 10,615,784 B2 | 4/2020 | Raimondi et al. |
| 2004/0169552 A1 | 9/2004 | Butler |
| 2011/0133836 A1 | 6/2011 | Yu et al. |
| 2015/0207498 A1 | 7/2015 | Raimondi et al. |
| 2017/0155381 A1 | 6/2017 | Raimondi et al. |
| 2018/0323774 A1 | 11/2018 | Raimondi et al. |
| 2019/0007009 A1* | 1/2019 | Berkhout ............ H03F 3/2175 |
| 2019/0123731 A1 | 4/2019 | Botti et al. |

OTHER PUBLICATIONS

Palmisano, G. et al., "An offset compensated fully differential CMOS current comparator," 38th Midwest Symposium on Circuits and Systems Proceedings, vol. 2, Rio de Janeiro, Brazil, Aug. 13-16, 1995, pp. 1038-1041, doi: 10.1109/MWSCAS.1995.510271.

* cited by examiner

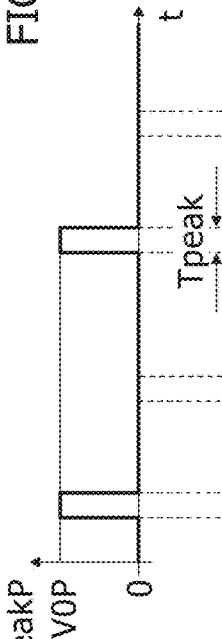
FIG. 4
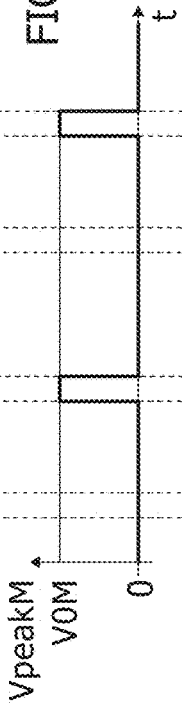
FIG. 5A
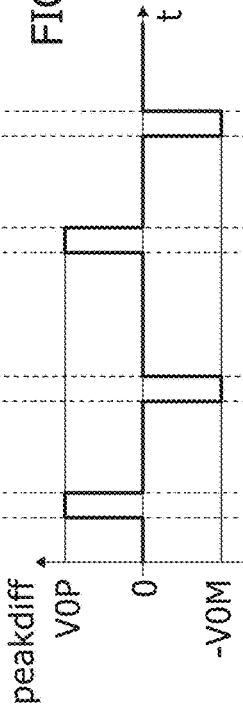
FIG. 5B
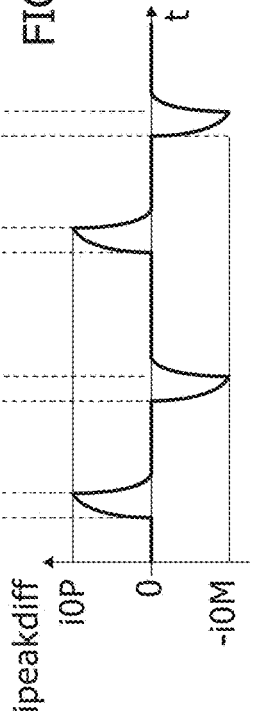
FIG. 5C
FIG. 5D

MODULATOR CIRCUIT, CORRESPONDING DEVICE AND METHOD

CROSS-REFERENCE TO RELATED APPLICATIONS

This application claims the priority benefit of Italian Patent Application No. 102020000014302, filed on Jun. 16, 2020, which application is hereby incorporated herein by reference.

TECHNICAL FIELD

The description relates to pulse-width modulation (PWM) modulator circuits. One or more embodiments can be applied in high-frequency PWM modulators, for instance. One or more embodiments can be advantageously applied in class-D audio power amplifiers.

BACKGROUND

A marked trend is noted today towards increasing the switching frequency in class-D power amplifiers.

Operation of class-D (or switching) amplifiers involves electronic switches being alternately switched on and off (that is, made conductive and non-conductive) via a modulator using pulse-width modulation (PWM) or related techniques to encode an (audio) input signal into a train of pulses. The amplified signal is recovered (demodulated) via a low-pass filter such as a LC filter to be applied to a loudspeaker, for instance.

A high switching frequency may facilitate reducing the cost of LC demodulation filters.

A high switching frequency is otherwise found to have possible consequences, such as increasing of disturbances due to an increase in switching slopes, and largely losing the benefits of in-phase modulation over out-phase modulation.

Improved PWM modulators, with increased robustness against disturbances and reduced area/current consumption are thus desirable for various applications.

SUMMARY

An object of one or more embodiments is to contribute in providing such improved solutions.

According to one or more embodiments, such an object can be achieved by means of a circuit having the features set forth in the claims that follow.

One or more embodiments may relate to a corresponding device. A class-D power amplifier for use in an audio system may be exemplary of such a device.

One or more embodiments may relate to a corresponding method.

The claims are an integral part of the technical teaching provided herein in respect of the embodiments.

One or more embodiments may provide an improved fully-differential PWM modulator exhibiting increased robustness against disturbances and reduced area/current specifications.

One or more embodiments may exhibit one or more of the following advantages: improved immunity to common-mode noise, due to the extended use of fully differential circuitry; creating open loop poles and zeroes is facilitated by the possibility of acting on the input impedances of a comparator: peaks can be created at the tops (vertexes) of a reference signal which are not necessarily "squared" and exhibit a finite slope, which facilitates control in the proximity of saturation; and the possible absence of a common mode control leads to a reduction in the number of components, which is advantageous both in terms of area occupied and for power consumption.

One or more embodiments can be advantageously applied in consumer audio applications, for instance in automotive audio systems.

One or more embodiments can be advantageously applied in class-D amplifiers with a full bridge final stage.

One or more embodiments can advantageously dispense with common-mode feedback: as a result, in the presence of a common mode load (a load towards ground or the supply voltage on both outputs, for instance), the common mode duty cycle of the two outputs is not altered.

BRIEF DESCRIPTION OF THE DRAWINGS

One or more embodiments will now be described, by way of example only, with reference to the annexed figures, wherein:

FIG. 4 is a circuit diagram exemplary of operation of a current comparator; and

FIGS. 5A to 5D are time diagrams showing possible time behaviors of signals which may occur in embodiments of the present disclosure.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

By way of introduction to the instant detailed description, one may note that the advantages of in-phase modulation can be become less relevant in high-frequency PWM modulators than in low frequency PWM modulators.

In fact: an advantage of in-phase modulation is related to the differential mode insofar as switching occurs at double frequency and with signal swing halved; this results in a reduction in a reduction of ripple across a load coupled to a modulator, which is helpful in avoiding an undesired increase of the size of LC components for the same purpose: with a high modulation frequency, the size of the LC filter is reduced, which makes a possible size increase more tolerable; in-phase modulation reduces the transfer of PWM clock noise to the differential output: with a high modulation frequency an adjustment ring can be provided having a very high gain in the audio band, which results in a high rejection capacity of such noise; and in-phase modulation avoids discontinuities in the differential signal when the PWM signal is turned on/off, preventing pop noise: with a high modulation frequency, these discontinuities are shifted to high frequencies, outside the audible range.

Conversely, an advantage of out-phase modulation compared to the in-phase modulation is related to common mode insofar as common mode harmonics weigh more than differential mode harmonics; this may be beneficial for emissions. Out-phase modulation provides a "firm" common mode, and the absence of appreciable modulation of the common mode remains notable also with an increase in the modulation frequency, with common mode generally regarded as of lesser interest than differential mode.

Figure 1B:
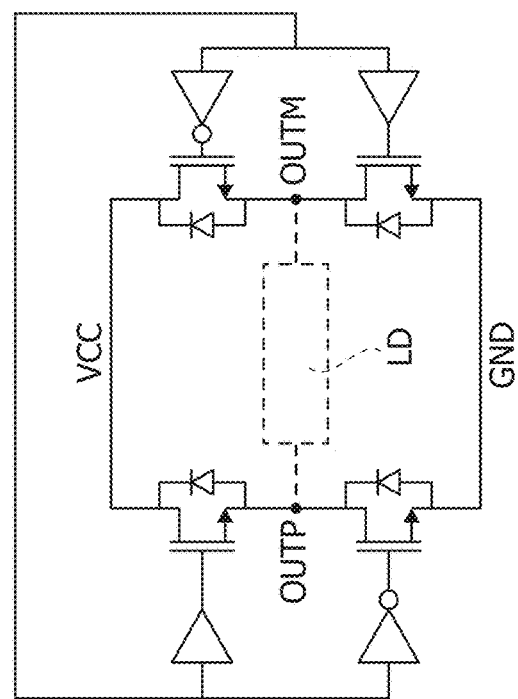
FIG. 1B is a circuit diagram exemplary of a full-bridge circuit driven with a common drive signal.
Figure 1A:
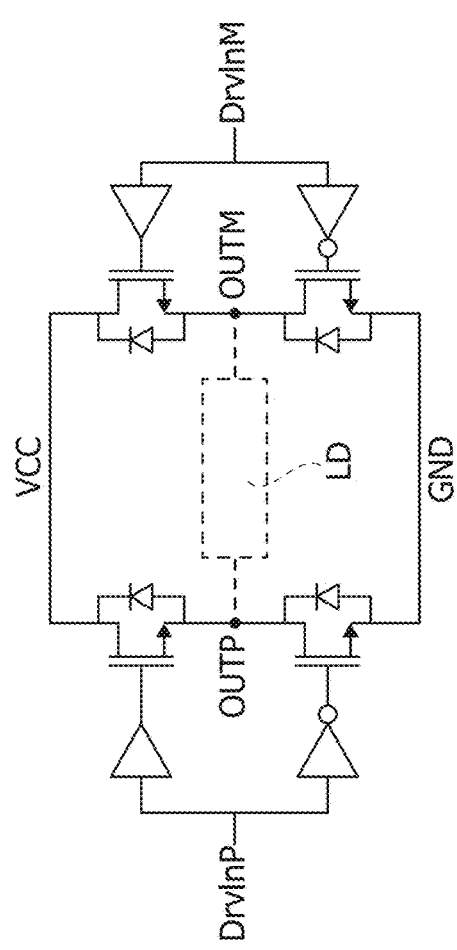
FIG. 1A is a circuit diagram exemplary of a full-bridge circuit driven with distinct drive signals.

FIGS. 1A and 1B are exemplary of the possibility (which can be regarded as conventional in the art) of creating an intrinsically differential final stage, where half-bridges are (always) driven with opposite phases (counter-phase operation).

FIGS. 1A and 1B show two half-bridges comprising electronic switches such as transistors (field-effect transistors such as metal-oxide-semiconductor (MOSFET) transistors may be exemplary of these switches) arranged intermediate a supply node or line VCC and ground GND.

A load LD is shown in dashed lines coupled between output nodes OUTP and OUTM intermediate the two transistors in each half-bridge.

In the quite general representation of FIGS. 1A and 1B the load LD may be representative of a fairly complex network.

For instance, in the case of a class-D audio amplifier comprising a final stage as exemplified in FIGS. 1A and 1B, the load LD may include, for instance, an LC demodulator filter, an output damping network and a load proper such as a loudspeaker system possibly including a crossover network.

The switches in the half-bridges exemplified in FIGS. 1A and 1B are configured to be switched on and off alternately in a PWM mode of operation via driver stages with complementary outputs (illustrated and not referenced for simplicity) that receive distinct drive signals DrvInP and DrvInM (FIG. 1A) or a same common drive signal DrvIn (FIG. 1B).

In the case of FIG. 1B, the two half-bridges receive only one input signal, namely DrvIn, dedicated to controlling the differential mode. Such a common mode of operation is not controllable from the outside and is intrinsically (notionally) fixed to VCC/2.

As noted, the switches (MOSFET transistors) in each one of the half-bridges exemplified in FIGS. 1A and 1B are driven with opposite phases (counter-phase operation) with the aim of avoiding cross-conduction.

In an arrangement as exemplified in FIG. 1A, each of the two-half bridges can be driven with a respective drive signal DrvInP, DrvInM (a logical signal having values '0' or '1', for instance).

That signal can be generated—in a manner known to those of skill in the art—via a comparator supplied with a modulating signal and a carrier signal (a triangular wave, for instance).

The carrier used to drive the "P" half-bridge has a certain phase relationship to the carrier used to drive the "M" half-bridge: in the case of in-phase modulation, the two carriers used to produce DrvInP and DrvInM are in-phase, that is, have a 0° mutual phase shift, and in the case of out-phase modulation, the two carriers used to produce DrvInP and DrvInM are in counter-phase, that is, have a 180° mutual phase shift.

The phase relationship between these carrier signals is mirrored by a corresponding phase relationship between the drive signals DrvInP and DrvInM (as discussed, these may be binary signals having voltage levels 0 and VCC corresponding to logical signal having values '0' or '1'), the same also applying to the output signals at the nodes OUTP and OUTM.

If (only) out-phase modulation is desired, an arrangement as exemplified in FIG. 1A can be modified as exemplified in FIG. 1B, where a single input signal DrvIn (obtained from a single carrier) is used to drive both half bridges, one in counter-phase with respect to the other: see the "crosswise" arrangement of the driver stages with complemented outputs in FIG. 1B in contrast with the "symmetrical" arrangement of the driver stages in FIG. 1A.

The solution of FIG. 1B is simpler than the solution of FIG. 1A, which involves two distinct carriers (and two related comparators). Also, the solution exemplified in FIG. 1A, including two distinct inputs DrvInP, DrvInM may involve a separate regulation of the common mode.

Still by way of introduction to the instant detailed description, documents US 2015/0207498 A1 (to which US 2017/0155381 A1, US 2018/0323774 A1, U.S. Pat. Nos. 9,595,946 B2, 10,027,315 B2 and 10,615,784 B2 correspond) disclose a method for reducing pulse skipping from a characteristic affecting a modulating signal input to an integrator of a pulse width modulation (PWM) modulator, together with a square wave carrier signal for generating a triangular waveform of the PWM modulator. Such a method may include creating a broad synchronous peak at vertexes of the triangular waveform output by the integrator.

Adding a peak on the vertexes of a carrier signal as discussed in these documents was found to improve amplifier behavior near saturation.

Providing such peaks at a high modulation frequency with feedback circuits would almost inevitably involve using amplifiers with a (very) fast response and high slew rates.

Circuits as exemplified herein may comprise a fully differential PWM modulator, which, on the one hand, may benefit from the advantages deriving from the characteristics of a final stage as previously mentioned, while overcoming certain limitations of the prior art.

Circuits as exemplified herein may apply both to open-loop and to closed-loop PWM modulators.

In the latter case, the regulation loop may include or may not include the LC demodulation filter, and/or may include one or more nested loops.

Figure 2:
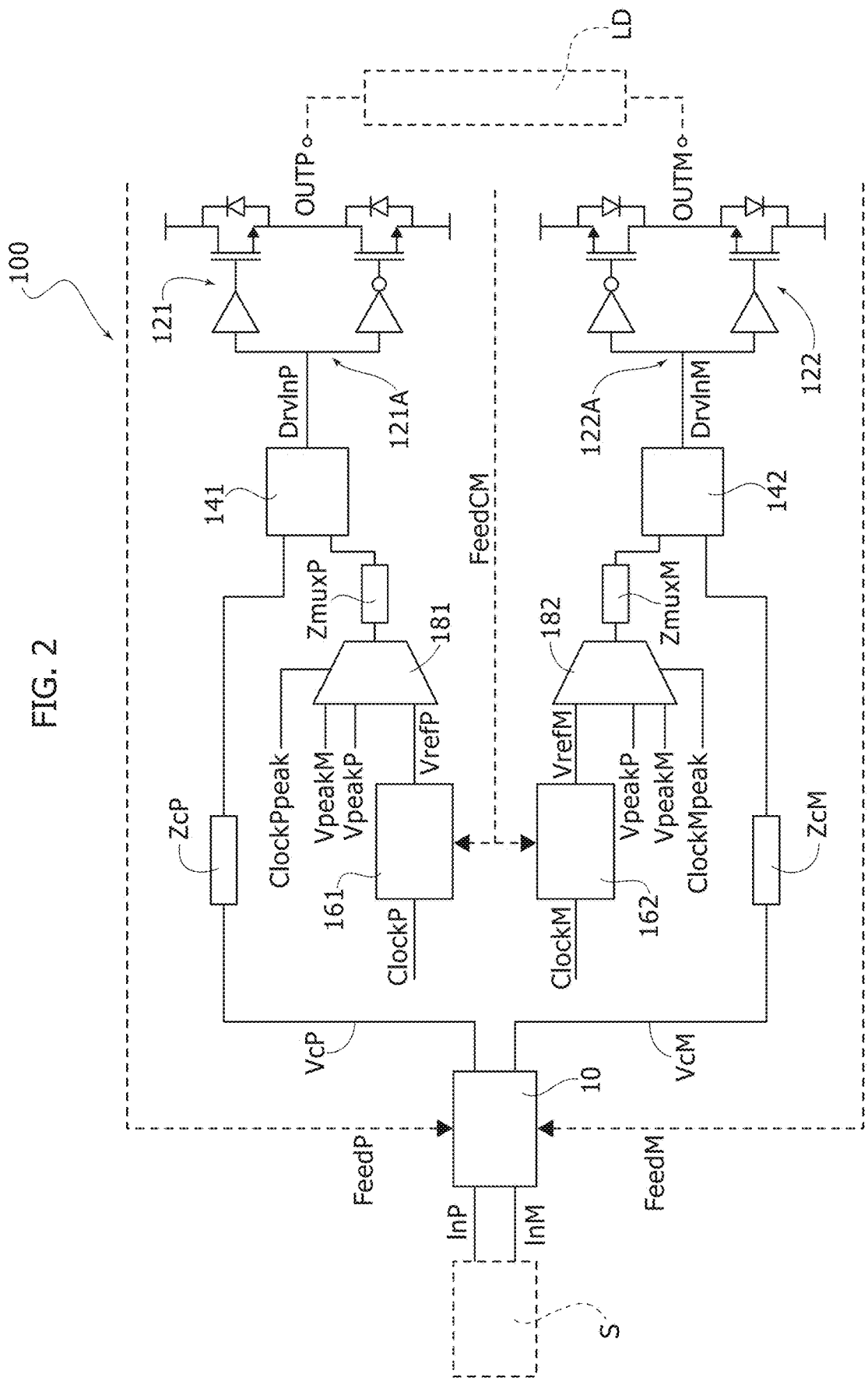
FIG. 2 is a block diagram exemplary of a PWM modulator circuit as per the present disclosure and comprising plural current comparators.

FIG. 2 is a block diagram of an exemplary architecture of a PWM modulator circuit, designated 100 as a whole.

FIG. 2 is exemplary of the possibility of applying a concept underlying embodiments as discussed herein (that is, using a current comparator in the place of a voltage comparator) in an otherwise conventional PWM modulator circuit.

The circuit 100 illustrated in FIG. 2 can be configured to receive a differential input signal (an audio signal, for instance) applied between two input nodes InP, InM as provided by a signal source S and to produce between two output nodes OUTP, OUTM a corresponding PWM modulated (differential) signal to be applied to a load LD.

Both the source S and the load LD are shown in dashed lines insofar as either or both of them may be distinct elements from the circuit 100 of embodiments.

Just like in the case of FIGS. 1A and 1B discussed previously, the load LD in FIG. 2 (and FIG. 3) may in fact be representative of a fairly complex network (for instance an LC demodulator filter, an output damping network, a loudspeaker system in the case of a class-D audio amplifier including a circuit 100 as exemplified herein.

Also, throughout this description, a same designation may be used for brevity to reference both certain node or line in a circuit and a signal occurring at that node or line. This may apply, for instance, for the input nodes InP, InM that receive the differential input signal from the source S.

As exemplified in FIG. 2, such a differential input signal (briefly InP, InM) is applied to the input of a differential stage 10 (a fully differential amplifier, for instance) which, starting from the differential input signal (InP−InM, for instance), generates two control signals VcP and VcM to be forwarded towards the half-bridges 121, 122 in a final stage of the circuit.

Those of skill in the art will otherwise appreciate that a fully differential amplifier is just one exemplary possible implementation of a differential stage 10 as considered herein.

By way of a further possible exemplary implementation, the differential stage 10 may comprise two single ended amplifiers: a first one, receiving the signal InP and forwarding a control signal VcP towards the half-bridge 121, and a second one, receiving the signal InM and forwarding a control signal VcM towards the half-bridge 122.

Here again (as in the case of FIGS. 1A and 1B) the two half-bridges 121, 122 may comprise electronic switches such as transistors. Field-effect transistors such as MOSFET transistors may be exemplary of these switches.

The load LD is shown in dashed lines coupled between output nodes OUTP and OUTM intermediate the two transistors in each half-bridge.

Here again, the switches in the half-bridges are configured to be alternately switched on and off via complementary driver stages 121A, 122A with complementary outputs controlled with distinct drive signals DrvInP and DrvInM.

As illustrated, the drive signals DrvInP and DrvInM are provided as outputs from respective—current—comparators 141, 142. These comparators are sensitive to carrier signals VrefP, VrefM (triangular waveforms, as discussed in the following) as well as to the control signals VcP and VcM from the differential stage 10 (a fully differential amplifier or a pair of complementary single ended amplifiers, for instance). This may occur via intermediate voltage-to-current converter impedances ZmuxP, ZmuxM and ZcP, ZcM.

In order to produce the carrier signals VrefP, VrefM, the exemplary circuit illustrated in FIG. 2 comprises two reference generators 161, 162 configured to be clocked by corresponding clock signals ClockP, ClockM from a clock source, not visible for simplicity.

This clock source may comprise clock circuitry of any type known to those of skill in the art for that purpose.

For instance, in case the circuit 100 is included in a class-D audio amplifier, such a clock source may be already provided in order to facilitate operation of the amplifier: such an amplifier may conventionally include a digital block timed with a clock signal from which a clock as discussed herein can be obtained via a clock divider, for instance.

The reference generators 161, 162 in the exemplary circuit of FIG. 2 may comprise single ended amplifiers.

For instance, the reference generators 161, 162 may comprise single ended amplifiers in an integrator configuration, which, starting from the clock signal ClockP, ClockM generate a (carrier) signal VrefP, VrefM with a triangular shape, for instance.

The reference carrier signals VrefP, VrefM are intended to be applied (converted into current signals via intermediate voltage-to-current converter impedances ZmuxP and ZmuxM, respectively, for instance) to the current comparators 141, 142 for comparison with the differential control signals VcP, VcM (also converted into current signals via intermediate voltage-to-current converter impedances ZcP and ZcM, respectively, for instance) so that PWM-modulated drive signals DrvInP, DrvInN to drive the first half-bridge stage 121 and the second half-bridge stage 122 are generated as a result of the comparison in the current comparators 141, 142.

In general terms, this type of operation (generation of PWM modulated signals) is otherwise conventional in the art, which makes it unnecessary to provide a more detailed description herein. As discussed in the following, a feature of modulators 100 as discussed herein is that the comparison leading to generation of PWM modulated signals is performed as a comparison of currents rather than as a comparison of voltages.

In the exemplary circuit 100 of FIG. 2 the reference signals VrefP, VrefM are sent towards the comparators 141, 142 for comparison with the control signals VcP, VcM via two multiplexers (MUX) 181, 182 configured to receive the signals VrefP, VrefM as well as threshold signals VpeakP, VpeakM from a reference threshold source and clock signals ClockPpeak, ClockMpeak from a clock source. These threshold/clock sources (which may comprise circuitry of any type known to those of skill in the art for that purpose) are not visible for simplicity.

For instance, the two multiplexers 181, 182 in the exemplary circuit 100 of FIG. 2 may comprise analog multiplexers which—based on timing signal ClockPpeak, ClockMpeak that switch around the vertexes of "carrier" signals such as VrefP, VrefM—may switch (force) their outputs to a fixed level (potential) with the aim of generating peaks.

A corresponding arrangement is disclosed, for instance, in US 2019/0123731 A1 (to which U.S. Pat. No. 10,560,082 B2 corresponds).

Briefly, a PWM modulation circuit as disclosed in those documents includes: a first circuit block configured to receive a square wave input signal and produce from the square wave input signal a triangular wave signal, a second circuit block configured to receive a modulating signal and produce a PWM signal by comparing the modulating signal with a carrier signal, a switching circuit block coupled between the first circuit block and the second circuit block and sensitive to reference signals having upper and lower reference values and selectively switchable between a carrier transfer setting in which the switching circuit block couples the first circuit block to the second circuit block to transfer the triangular wave signal as the carrier signal, and one or more carrier forcing settings for optimizing or inhibiting pulse skipping in the PWM signal, wherein the switching circuit block forces the carrier signal to the upper and lower reference values, respectively.

The outputs from the multiplexers 181, 182 are supplied (for instance, via the intermediate voltage-to current converter impedances ZmuxP and ZmuxM, respectively) to the current comparators 141, 142 that are configured to produce the drive signals DrvInP, DrvInM for the half-bridges 121, 122 in the final stage.

The exemplary circuit of FIG. 2 further comprises a common mode feedback line FeedCM (shown in dashed line) coupled to the generators 161, 162 to act on the baseline of the carrier signals VrefP, VrefM as well as differential mode feedback lines FeedP and FeedM (likewise shown in dashed line) acting on the differential stage 10 (a fully differential amplifier or a pair of complementary single ended amplifiers, for instance) that generates the control signals VcP, VcM.

Such a feedback arrangement and the related principles of operation are otherwise conventional in the art, which makes it unnecessary to provide a more detailed description herein.

An advantageous feature of the exemplary circuit of FIG. 2 lies in that the comparators 141, 142 comprise, in the place of voltage comparators, (differential) current comparators 141, 142 which receive at their inputs current signals to be compared as provided via the voltage-to current converter impedances ZcP, ZcM and ZmuxP, ZmuxM, respectively.

It is noted that a voltage comparator is known to exhibit an expectedly high input impedance (as provided by gate terminals of field-effect transistors such as MOSFET transistors, for instance). This is in contrast with a current comparator which is known to exhibit an expectedly low input impedance (as provided by source terminals of field-effect transistors such as MOSFET transistors, for instance).

In circuits as exemplified herein (using a current comparator in the place of a voltage comparator) a logical value can be used for driving the half-bridges 121, 122 which represents the sign of the difference of the currents entering the two input terminals of the comparators 141, 142.

This concept is further exemplified in the diagram of FIG. 3 where entities, elements or parts like entities, elements or parts already discussed in connection with the previous figures are indicated with like reference symbols; a corresponding detailed description will not be repeated for brevity.

As noted, the diagram of FIG. 2 is exemplary of a modulator circuit 100 wherein the half-bridges 121, 122 in the final (power) stage are controlled by respective drive signals DrvInP, DrvInM, like in the case of the solution illustrated in FIG. 1A.

Figure 3:
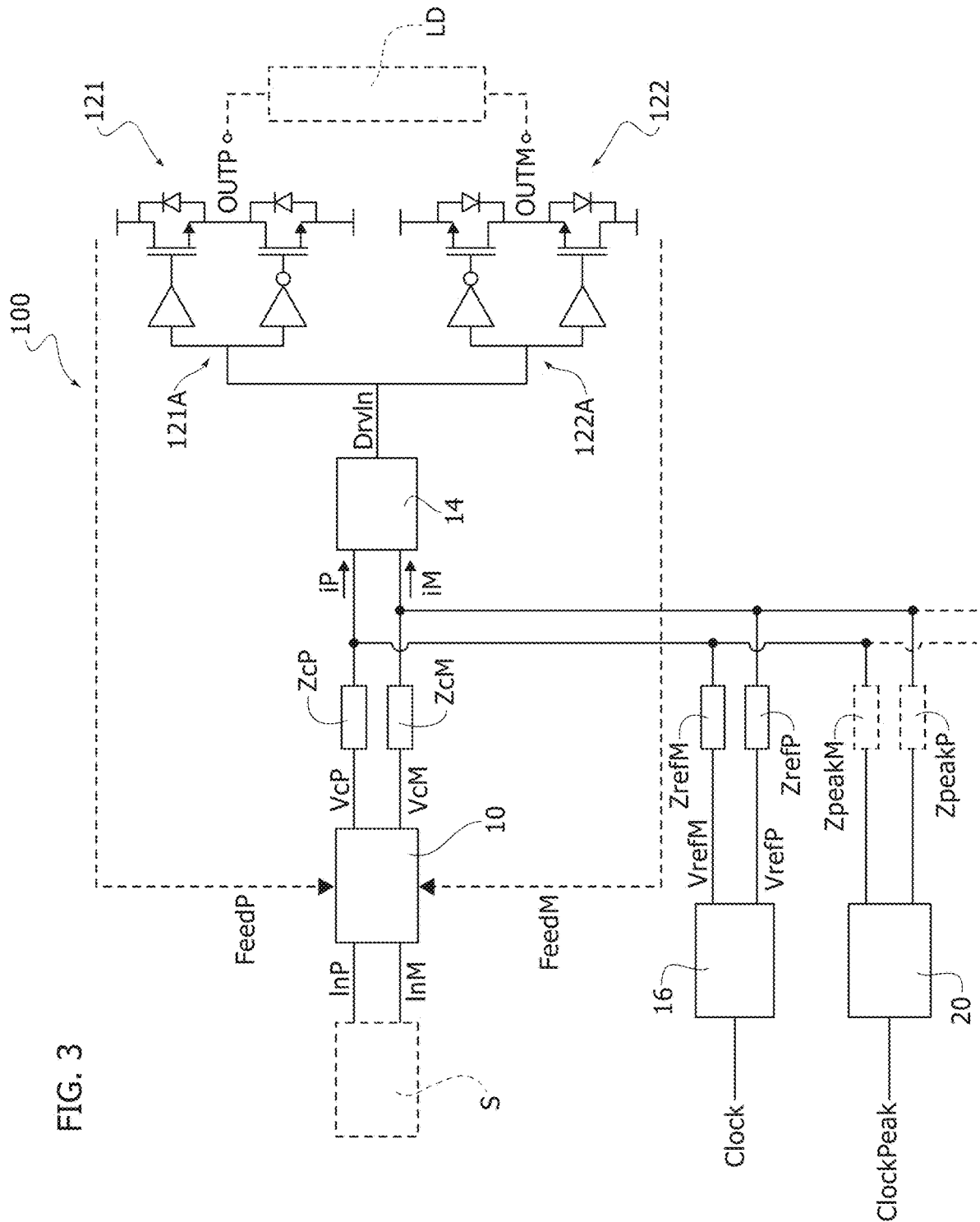
FIG. 3 is a block diagram exemplary of a PWM modulator circuit as per the present disclosure and comprising a single current comparator.

Conversely, the diagram of FIG. 3 is exemplary of a modulator circuit 100 wherein the switches in the half-bridges are configured to be alternately switched on and off via complementary driver stages 121A, 122A with complementary outputs controlled by a single drive signal DrvIn, like in the case of the solution illustrated in FIG. 1B.

Also, it will be appreciated that certain features illustrated in the following for simplicity in connection with the architecture of FIG. 3, which comprises a single current comparator designated 14, can be applied to the architecture of FIG. 2, which comprises two current comparators 141, 142. Likewise, certain features already illustrated in connection with the two-comparator architecture of FIG. 2 can be applied to the single-comparator architecture of FIG. 3.

In the exemplary circuit of FIG. 3 the single drive signal DrvIn used to drive the half-bridges 121, 122 is again obtained via a current comparator 14 in the place of a voltage comparator.

In that way, a logical value can be used for driving the half-bridges 121, 122 which represents the sign of the difference of the currents entering the two input terminals of the comparator 14 (namely iP−iM).

It is noted that current comparators such as 14 (and 141, 142 as well) exhibit ideally zero input impedance, so that different pairs of signals can be connected to their inputs, all decoupled from each other.

A first pair of input signals may correspond to the differential control signals, obtained from the control voltages VcP and VcM, transformed into currents through voltage-to-current converter access impedances such as ZcP, ZcM (see, for instance iP−iM as applied to the current comparator 14 in FIG. 3).

A second pair of input signals may correspond to the carrier reference signals VrefM, VrefP originating from differential reference generation clocked by a (single) clock signal Clock (see ClockP and ClockM in FIG. 2), again transformed into currents through voltage-to-current converter impedances such as ZrefM, ZrefP (see, for instance, the differential output voltage VrefP−VrefM from the generator 16 having the impedances ZrefM, ZrefP coupled at its outputs in FIG. 3).

A third pair of input signals may correspond to peaks applied at the vertexes of the carrier signals VrefM, VrefP: see the various patent documents cited in the respect previously in discussing the architecture illustrated in FIG. 2.

These peaks can be produced by a differential peak generator 20 in operation clocked by a (single) differential clock signal ClockPeak (see ClockPpeak and ClockMpeak in FIG. 2 and also the discussion of FIGS. 4 and 5A to 5D below).

The differential peak generator 20 can be configured to generate a differential voltage which is then transformed into a current through voltage-to-current converter access impedances ZpeakM, ZpeakP. Alternatively, the differential peak generator 20 can be configured to generate directly a corresponding differential current (for that reason the impedances ZpeakM, ZpeakP are illustrated in dashed lines.

Other pairs of signals can be connected to the inputs of the current comparator 14 as possibly desired, taking advantage of the mutual decoupling feature discussed previously.

Matching the impedances in the pairs, namely ZcP=ZcM, ZrefP=ZrefM, ZpeakP=ZpeakM, was found to be advantageous in order to facilitate adequate operation of a fully differential architecture as exemplified in FIG. 3. Achieving a very strict matching is not otherwise mandatory insofar as mismatch leads to a (small) common mode signal which may result from the differential signal. The circuits arranged downstream being differential circuits results in this small common mode signal being hardly transferred.

Polysilicon resistors were found to provide a matching adequate for the purposes herein, with the advantage of good linear behavior and reduced sensitivity to disturbances from the substrate.

Also, resorting to a current comparator architecture as disclosed in G. Palmisano and G. Palumbo, "An offset compensated fully differential CMOS current comparator," 38*th Midwest Symposium on Circuits and Systems. Proceedings*, Rio de Janeiro, Brazil, 1995, pp. 1038-1041 vol. 2, doi: 10.1109/MWSCAS.1995.510271 was found to be advantageous for comparators such as 14, 141, 142 illustrated herein.

A current comparison, in the place of a voltage comparison is advantageous insofar as, for instance, it can facilitate providing peaks at the vertexes of a triangular carrier by making the related circuitry simpler and more flexible (especially when resorting to the layout illustrated in FIG. 3).

FIG. 4 is exemplary of a differential current comparator 14 as exemplified in FIG. 3 supplied with a differential peak voltage Vpeakdiff=VpeakP−VpeakM used to charge a capacitor C via impedances (resistors) R1P, R1M. As illustrated, the voltage across the capacitor C is transferred to the differential (current) inputs of the comparator 14 via further impedances (resistors) R2P, R2M so that a current ipeakdiff circulates through the comparator input.

Assuming matching conditions as discussed previously, namely R1P=R1M=R1 and R2P=R2M=R2, possible time behaviors of VpeakP and VpeakM can be as exemplified in FIGS. 5A and 5B against a common (abscissa) time scale. That is, VpeakP and VpeakM may comprise pulse signals with pulse width (time duration) Tpeak with a same peak value VoP=VoM; then Vpeakdiff and ipeakdiff may exhibit time behaviors as exemplified in FIGS. 5C and 5D against the same common (abscissa) time scale of FIGS. 5A and 5B.

In mathematical terms, this can be expressed as:

$$i\text{peakdiff}/V\text{peakdiff}=1/(R1+R2)\cdot 1/1+[sC(2R1\cdot R2)/(R1+R2)]=k/(1+s\tau)$$

with the amplitude of the current peaks (see FIG. 5D) expressed as:

$$ioP=ioM=Vo\cdot k(1-e^{-Tpeak/\tau}).$$

A (PWM modulator) circuit as exemplified herein (for instance, 100) may comprise: a first half-bridge stage (for instance, 121) having a first output node (for instance, OUTP) and a second half-bridge stage (for instance, 122) having a second output node (for instance, OUTM), the first output node and the second output node configured to have an electrical load (for instance, LD) coupled therebetween to apply thereto a PWM-modulated output signal, a differential stage (for instance, 10: this may be a fully differential amplifier or a pair of complementary single ended amplifiers) having input nodes (for instance, InP, InM) configured to receive an input signal applied between the input nodes and produce a differential control signal (for instance, VcP, VcM) for the first half-bridge stage and the second half-bridge stage, and at least one current comparator (for instance, 14; 141, 142) intermediate the differential stage and the first and second half-bridge stages, the at least one current comparator configured to produce at least one PWM-modulated drive signal (for instance, DrvIn; DrvInP, DrvInN) to drive the first half-bridge stage and the second half-bridge stage as a function of the input signal applied between the input nodes in the differential stage.

As repeatedly discussed, the differential stage 10 as considered herein lends itself to being implemented in different ways. For instance a possible alternative to a fully differential amplifier, may involve "splitting" the differential stage 10 into two single ended amplifiers: a first one, receiving the signal InP and forwarding a control signal VcP towards the half-bridge 121, and a second one, receiving the signal InM and forwarding a control signal VcM towards the half-bridge 122.

A circuit as exemplified herein may comprise a current comparator intermediate the differential stage and the first and second half-bridge stages, the current comparator configured to produce as a function of the input signal applied between the input nodes in the differential stage a common PWM-modulated drive signal (for instance, DrvIn) applied to both the first half-bridge stage and the second half-bridge stage.

A circuit as exemplified herein may comprise: a first current comparator (for instance, 141) intermediate the differential stage and the first half-bridge stage, the first current comparator configured to produce as a function of the input signal applied between the input nodes in the differential stage a first PWM-modulated drive signal (for instance, DrvInP) applied to the first half-bridge stage, and a second current comparator (for instance, 142) intermediate the differential stage and the second half-bridge stage, the second current comparator configured to produce as a function of the input signal applied between the input nodes in the differential stage (10) a second PWM-modulated drive signal (for instance, DrvInM) applied to the second half-bridge stage.

A circuit as exemplified herein may comprise at least one pair of matched impedances (for instance, ZcP, ZcM; ZmuxP, ZmuxM; R1P, R1M, R2P, R2M) coupled to the inputs of the at least one current comparator to provide voltage-to-current conversion of signals applied to the at least one current comparator.

A circuit as exemplified herein may comprise at least one reference signal generator (for instance, 16, 161, 162) coupled (for instance, ZmuxP, ZmuxM; ZrefP, ZrefM) to the at least one current comparator, the at least one reference signal generator configured to produce at least one carrier signal (for instance, VrefP, VrefM) for comparison with the differential control signal at the current comparator, wherein the at least one PWM-modulated drive signal to drive the first half-bridge stage and the second half-bridge stage is a result of the (current) comparison.

A circuit as exemplified herein may comprise peak-generation circuitry (for instance, 20, ZpeakP, ZpeakM in FIG. 3 or 181, 182, VpeakP, VpeakM in FIG. 2 or VpeakP, VpeakM, R1P, R1M, C, R2P, R2M, 14 in FIG. 4) configured to force to fixed values (for instance, VpeakP, VpeakM) the vertexes of the at least one carrier signal.

In a circuit as exemplified herein, the peak-generation circuitry may comprise current peak generator circuitry configured to inject into the at least current comparator current peaks (see 14 and ipeakdiff in FIG. 4) at the vertexes of the at least one carrier signal.

As discussed, such a peak generator circuitry (see 20 in FIG. 3, for instance) can be configured to generate directly a current as desired, rather than a voltage to be converted into a current (see ZpeakM and ZpeakP illustrated in dashed lines in FIG. 3, for instance).

In a circuit as exemplified herein, the first half-bridge stage may comprises a first pair of electronic switches having the first output node therebetween and the second half-bridge stage may comprises a second pair of electronic switches having the second output node therebetween; the electronic switches in the pairs may be configured to be alternately switched on and off via driver stages (for instance, 121A, 122A) with complementary outputs.

A device as exemplified herein may comprise: a circuit (for instance, 100) as exemplified herein, a signal source (for instance, S) coupled to the input nodes (for instance, InP, InM) of the differential stage and configured to apply an input signal between the input nodes, and an electrical load (for instance, LD) coupled intermediate the first output node of the first half-bridge stage and the second output node of the second half-bridge stage to have the PWM-modulated output signal applied thereto.

A device as exemplified herein may comprise a class-D (e.g. audio) amplifier.

For instance, modulator circuits as exemplified herein can be advantageously used in class-D amplifiers which implement an output voltage control strategy, in contrast with class-D amplifiers which implement an output current control strategy (for instance, via a flip-flop which is set at each clock cycle and reset as a result of the output inductor current reaching a threshold level).

A method of driving a circuit or a device as exemplified herein may comprise: applying an input signal between the input nodes (InP, InM) of the differential stage, and collecting between the first output node in the first half-bridge stage and the second output node in the second half-bridge stage a PWM-modulated output signal which is a function of the input signal applied between the input nodes in the differential stage (10).

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:
   a first half-bridge stage having a first output node;
   a second half-bridge stage having a second output node, the first output node and the second output node configured to provide a pulse-width modulation (PWM)-modulated output signal to an electrical load coupled therebetween;
   a differential stage having input nodes configured to receive an input signal applied between the input nodes and produce a differential control signal;
   at least one current comparator intermediate the differential stage and the first and second half-bridge stages, the at least one current comparator configured to receive the differential control signal, and to produce at least one PWM-modulated drive signal to drive the first half-bridge stage and the second half-bridge stage as a function of the input signal applied between the input nodes in the differential stage; and
   at least one pair of matched impedances coupled to inputs of the at least one current comparator, the at least one pair of matched impedances configured to provide voltage-to-current conversion of signals applied to the at least one current comparator.

2. The circuit of claim 1, wherein the at least one current comparator is configured to produce, as the function of the input signal applied between the input nodes in the differential stage, a common PWM-modulated drive signal applied to both the first half-bridge stage and the second half-bridge stage.

3. The circuit of claim 1, wherein the at least one current comparator comprises:
   a first current comparator intermediate the differential stage and the first half-bridge stage, the first current comparator configured to produce, as the function of the input signal applied between the input nodes in the differential stage, a first PWM-modulated drive signal applied to the first half-bridge stage; and
   a second current comparator intermediate the differential stage and the second half-bridge stage, the second current comparator configured to produce, as the function of the input signal applied between the input nodes in the differential stage, a second PWM-modulated drive signal applied to the second half-bridge stage.

4. The circuit of claim 1, further comprising at least one reference signal generator coupled to the at least one current comparator, the at least one reference signal generator configured to produce at least one carrier signal for comparison with the differential control signal, wherein the at least one PWM-modulated drive signal is a result of the comparison.

5. The circuit of claim 4, further comprising peak-generation circuitry configured to force vertexes of the at least one carrier signal to fixed values.

6. The circuit of claim 5, wherein the peak-generation circuitry comprises current peak generator circuitry configured to inject, into the at least one current comparator, current peaks at the vertexes of the at least one carrier signal.

7. The circuit of claim 1, wherein the first half-bridge stage comprises a first pair of electronic switches having the first output node therebetween, and the second half-bridge stage comprises a second pair of electronic switches having the second output node therebetween, wherein the electronic switches in the pairs are configured to be alternately switched on and off via driver stages with complementary outputs.

8. A device comprising:
   a circuit comprising:
      a first half-bridge stage having a first output node;
      a second half-bridge stage having a second output node, the first output node and the second output node configured to provide a pulse-width modulation (PWM)-modulated output signal;
      a differential stage having input nodes configured to receive an input signal applied between the input nodes and produce a differential control signal; and
      at least one current comparator intermediate the differential stage and the first and second half-bridge stages, the at least one current comparator configured to receive the differential control signal, and to produce at least one PWM-modulated drive signal to drive the first half-bridge stage and the second half-bridge stage as a function of the input signal applied between the input nodes in the differential stage;
      at least one pair of matched impedances coupled to inputs of the at least one current comparator to provide voltage-to-current conversion of signals applied to the at least one current comparator;
   a signal source coupled to the input nodes of the differential stage and configured to apply the input signal between the input nodes; and
   an electrical load coupled intermediate the first and second output nodes and configured to receive the PWM-modulated output signal.

9. The device of claim 8, wherein the device comprises a class-D amplifier.

10. The device of claim 8, wherein the at least one current comparator is configured to produce, as the function of the input signal applied between the input nodes in the differential stage, a common PWM-modulated drive signal applied to both the first half-bridge stage and the second half-bridge stage.

11. The device of claim 8, wherein the at least one current comparator comprises:
    a first current comparator intermediate the differential stage and the first half-bridge stage, the first current comparator configured to produce, as the function of the input signal applied between the input nodes in the differential stage, a first PWM-modulated drive signal applied to the first half-bridge stage; and
    a second current comparator intermediate the differential stage and the second half-bridge stage, the second current comparator configured to produce, as the function of the input signal applied between the input nodes in the differential stage, a second PWM-modulated drive signal applied to the second half-bridge stage.

12. The device of claim 8, wherein the circuit further comprises at least one reference signal generator coupled to the at least one current comparator, the at least one reference signal generator configured to produce at least one carrier signal for comparison with the differential control signal, wherein the at least one PWM-modulated drive signal is a result of the comparison.

13. The device of claim 12, wherein the circuit further comprises peak-generation circuitry configured to force vertexes of the at least one carrier signal to fixed values.

14. The device of claim 13, wherein the peak-generation circuitry comprises current peak generator circuitry configured to inject, into the at least one current comparator, current peaks at the vertexes of the at least one carrier signal.

15. The device of claim 8, wherein the first half-bridge stage comprises a first pair of electronic switches having the first output node therebetween, and the second half-bridge stage comprises a second pair of electronic switches having the second output node therebetween, wherein the electronic switches in the pairs are configured to be alternately switched on and off via driver stages with complementary outputs.

16. A method of driving a circuit comprising a first half-bridge stage having a first output node, a second half-bridge stage having a second output node, a differential stage having input nodes, and at least one current comparator intermediate the differential stage and the first and second half-bridge stages, the method comprising:
    receiving an input signal between the input nodes of the differential stage;
    generating, by the differential stage, a differential control signal;
    receiving, by the at least one current comparator, the differential control signal;
    providing, by at least one pair of matched impedances coupled to inputs of the at least one current comparator, voltage-to-current conversion of signals applied to the at least one current comparator;
    driving, by the at least one current comparator, the first half-bridge stage and the second half-bridge stage with at least one pulse-width modulation (PWM)-modulated drive signal as a function of the input signal; and
    providing, to an electrical load coupled between the first and second output nodes, a PWM-modulated output signal that is a function of the input signal.

17. The method of claim 16, further comprising producing, by the at least one current comparator, as the function of the input signal applied between the input nodes in the differential stage, a common PWM-modulated drive signal applied to both the first half-bridge stage and the second half-bridge stage.

18. The method of claim 16, wherein the at least one current comparator comprises a first current comparator intermediate the differential stage and the first half-bridge stage, and a second current comparator intermediate the differential stage and the second half-bridge stage, and the method further comprises:
    producing, by the first current comparator, as the function of the input signal applied between the input nodes in the differential stage, a first PWM-modulated drive signal applied to the first half-bridge stage; and
    producing, by the second current comparator, as the function of the input signal applied between the input nodes in the differential stage, a second PWM-modulated drive signal applied to the second half-bridge stage.

19. The method of claim 16, further comprising producing, by at least one reference signal generator coupled to the at least one current comparator, at least one carrier signal for comparison with the differential control signal, the at least one PWM-modulated drive signal being a result of the comparison.

20. The method of claim 19, further comprising forcing, by peak-generation circuitry, vertexes of the at least one carrier signal to fixed values.

21. The method of claim 20, further comprising injecting, into the at least one current comparator, by current peak generator circuitry in the peak-generation circuitry, current peaks at the vertexes of the at least one carrier signal.

22. The method of claim 16, wherein the first half-bridge stage comprises a first pair of electronic switches having the first output node therebetween, and the second half-bridge stage comprises a second pair of electronic switches having the second output node therebetween, and method further comprises:
    alternately switching, by driver stages with complementary outputs, the electronic switches in the pairs on and off.

* * * * *